(12) United States Patent
Huang et al.

(10) Patent No.: US 11,369,020 B2
(45) Date of Patent: *Jun. 21, 2022

(54) STACKED TRANSMISSION LINE

(71) Applicant: Invensas LLC, San Jose, CA (US)

(72) Inventors: Shaowu Huang, Sunnyvale, CA (US); Javier A. Delacruz, San Jose, CA (US); Belgacem Haba, Saratoga, CA (US)

(73) Assignee: Invensas LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/172,271

(22) Filed: Oct. 26, 2018

(65) Prior Publication Data

US 2019/0069392 A1 Feb. 28, 2019

Related U.S. Application Data

(63) Continuation of application No. 15/192,549, filed on Jun. 24, 2016, now Pat. No. 10,149,377.

(51) Int. Cl.
| | |
|---|---|
| *H05K 1/02* | (2006.01) |
| *H05K 1/18* | (2006.01) |
| *H05K 1/11* | (2006.01) |
| *H01P 3/08* | (2006.01) |
| *H05K 3/10* | (2006.01) |

(Continued)

(52) U.S. Cl.
CPC ......... *H05K 1/0228* (2013.01); *H01L 21/486* (2013.01); *H01L 23/49827* (2013.01); *H01L 23/49838* (2013.01); *H01L 23/66* (2013.01); *H01P 3/081* (2013.01); *H01P 5/028* (2013.01); *H03H 7/38* (2013.01); *H05K 1/0245* (2013.01); *H05K 1/0248* (2013.01); *H05K 1/0298* (2013.01); *H05K 1/115* (2013.01); *H05K 1/181* (2013.01); *H05K 3/10* (2013.01); *H01L 23/49822* (2013.01); *H01L 2223/6616* (2013.01); *H01L 2223/6627* (2013.01);

(Continued)

(58) Field of Classification Search
CPC .. H05K 1/0228; H05K 1/0245; H05K 1/0248; H05K 1/0298; H05K 1/115; H05K 1/181; H01L 21/486; H01L 23/49827; H01L 23/49838; H01L 23/66; H01P 3/081; H01P 5/028; H03H 7/38

See application file for complete search history.

(56) References Cited

U.S. PATENT DOCUMENTS

| | | |
|---|---|---|
| 8,159,310 B2 | 4/2012 | Park et al. |
| 9,240,621 B2 | 1/2016 | Abbott et al. |

(Continued)

FOREIGN PATENT DOCUMENTS

| | | |
|---|---|---|
| WO | 2014-149166 A1 | 9/2014 |

OTHER PUBLICATIONS

International Search Report and Written Opinion for PCT Application No. PCT/US2017/038107, dated Aug. 28, 2017, 11 pages.

*Primary Examiner* — Samuel S Outten
(74) *Attorney, Agent, or Firm* — Haley Guiliano LLP

(57) ABSTRACT

A stacked, multi-layer transmission line is provided. The stacked transmission line includes at least a pair of conductive traces, each conductive trace having a plurality of conductive stubs electrically coupled thereto. The stubs are disposed in one or more separate spatial layers from the conductive traces.

18 Claims, 12 Drawing Sheets

(51) Int. Cl.
- *H03H 7/38* (2006.01)
- *H01P 5/02* (2006.01)
- *H01P 11/00* (2006.01)
- *H01P 3/02* (2006.01)
- *H01P 3/18* (2006.01)
- *H01L 23/66* (2006.01)
- *H01L 23/498* (2006.01)
- *H01L 21/48* (2006.01)

(52) U.S. Cl.
CPC ............... *H01P 3/026* (2013.01); *H01P 3/18* (2013.01); *H01P 11/003* (2013.01)

(56) References Cited

U.S. PATENT DOCUMENTS

| | | |
|---|---|---|
| 9,722,012 B1 | 8/2017 | Pathmanathan et al. |
| 2010/0327989 A1 | 12/2010 | Abbott et al. |
| 2011/0090028 A1 | 4/2011 | Park et al. |
| 2012/0235141 A1 | 9/2012 | Masubuchi et al. |
| 2014/0268614 A1 | 9/2014 | Zhang et al. |
| 2015/0085458 A1* | 3/2015 | Enriquez Shibayama .................. H01L 23/49822 361/774 |
| 2017/0093007 A1* | 3/2017 | Elsherbini ............... H01P 3/085 |

\* cited by examiner

US 11,369,020 B2

STACKED TRANSMISSION LINE

CROSS-REFERENCE TO RELATED APPLICATIONS

This patent application is a continuation of and hereby claims priority to U.S. patent application Ser. No. 15/192,549, filed Jun. 24, 2016, the entirety of which is hereby incorporated by reference herein for all purposes.

FIELD

The following description relates to transmission lines used with integrated circuits ("ICs"). More particularly, the following description relates to stacked, multi-layer micro-strip transmission lines within an IC package or on a printed circuit board (PCB).

BACKGROUND

Microelectronic elements often comprise a thin slab of a semiconductor material, such as silicon or gallium arsenide, commonly called a semiconductor chip or die. Dies are commonly provided as individual, prepackaged units. In some unit designs, the die is mounted to a substrate or a chip carrier, which is in turn mounted on a circuit panel or carrier, such as a printed circuit board (PCB).

Active circuitry is often fabricated on a first face of the die (e.g., a front surface). To facilitate electrical connection to the active circuitry, the die is provided with bond pads on the same face. The bond pads are typically placed in a regular array either around the edges of the die or, for many memory devices, in the die center. The bond pads are generally made of a conductive metal, such as copper or aluminum, and can be about 0.5 micron (µm) thick. The bond pads can include a single layer or multiple layers of metal. The size of the bond pads can vary with the device type, but often measure tens to hundreds of microns on a side.

Microelectronic elements such as semiconductor dies typically require many input and output connections to other electronic components. The input and output contacts of a die or other comparable device are generally disposed in grid-like patterns that substantially cover a surface of the die (commonly referred to as an "area array") or in elongated rows which may extend parallel to and adjacent to each edge of the die's front surface, or in the center of the front surface. Dies can be provided in packages that facilitate handling of the die during manufacture and during mounting of the die on an external substrate such as a circuit board or other circuit panel. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

The input and output connections, and other thin traces making connections within the semiconductor die package may be implemented as transmission lines (such as micro-strip transmission lines, for example), which comprise conductors having a cross-section that is several to tens of microns across. Additionally, transmission lines may be used to interconnect the package to the PCB carrier, and may be used to make various other connections on the PCB carrier as well. Noise in the form of far end crosstalk (FEXT) can be induced on conductors of transmission lines from signals propagating on other nearby conductors of the circuit. This can create challenges to accurate signal transmission via the transmission lines, particularly as the scale and pitch of the transmission lines becomes finer.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure. Dimensions or scales shown in the illustrations are for discussion purposes. Described and illustrated devices and components may have different dimensions and remain within the scope of the disclosure.

DETAILED DESCRIPTION

Overview

Figure 1:
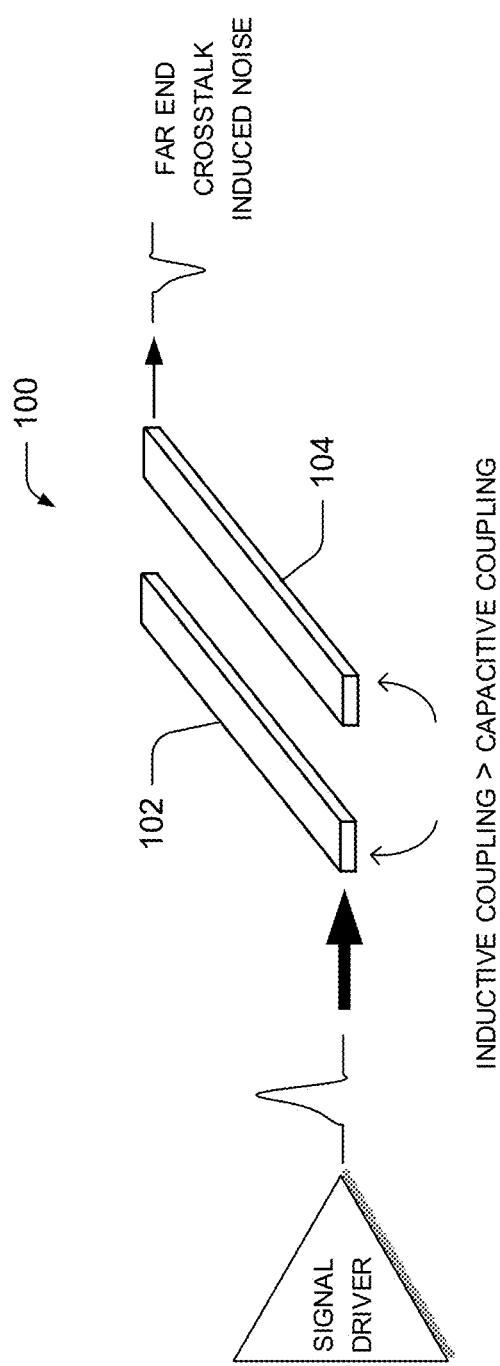
FIG. 1 shows a pair of adjacent conductive traces, which illustrate far-end crosstalk noise, and provide an example environment for the disclosed techniques and devices.

A stacked, multi-layer microelectronic structure is disclosed. In an implementation, the stacked, multi-layer structure comprises a three-dimensional transmission line arranged to reduce or eliminate noise based on far end crosstalk (FEXT) that may be induced onto the transmission line. The stacked transmission line includes at least a pair of conductive traces, which may comprise micro-strip transmission lines. Each conductive trace has a plurality of conductive stubs electrically coupled thereto. The stubs are disposed in one or more separate spatial layers from the conductive traces, forming a stacked, three-dimensional (multi-layer) structure. The location or placement of the stubs increases capacitive coupling between the conductive traces to match the inductive coupling of the traces, and thereby reduces or eliminates the amplitude of the FEXT noise.

In various implementations, the stacked transmission line is disposed on a carrier, such as a printed circuit board (PCB) or the like, or on or within a package, such as an integrated circuit (IC) package or the like. In the implementations, the stacked transmission line structure is disposed at multiple spatial layers of the carrier or the package. In other words, the structure includes multiple three-dimensional layers of components or materials.

In one embodiment, the conductive stubs are coupled to a top-side or a bottom-side surface of the conductive traces. In the embodiment, the stubs and the conductive trace are overlapped, and are bonded mechanically and electrically at the overlapped portion. In a similar embodiment, the stubs and the conductive traces are formed (e.g., by deposition, plating, etc.) in layers, one layer after the other, with an overlapping portion joining the stubs to the conductive traces. In another embodiment, the conductive stubs are coupled to a top-side or a bottom-side surface of the conductive traces using conductive vias. In the embodiment, the vias couple (mechanically and electrically) the stubs to their respective traces. In additional embodiments, other techniques may be used to couple the stubs to the conductive traces, and in each case, a three-dimensional, multi-layer structure is formed by coupling the stubs to the conductive traces.

In other implementations, additional conductive traces may be disposed with (e.g., nearby, adjacent, parallel, etc.) the pair of conductive traces, and may form additional transmission lines on the carrier or within the package. In the implementations, additional stubs are coupled to the additional conductive traces to mitigate FEXT noise by increasing capacitive coupling between traces.

Advantages of the disclosed techniques and devices are varied, and include: 1) reduction or elimination of far end crosstalk (FEXT) noise; 2) denser routing of traces enabled by a reduction in induced noise between the traces; 3) capacity for narrower traces with a finer pitch between traces due to a stacked, three-dimensional arrangement; 4) more useable space on a carrier or in a package as compared to a single-plane arrangement based on the stacked, 3D arrangement; 5) cost advantages may be realized by optimizing or minimizing carrier and package real estate; and 6) improved electrical performance due to the noise reduction on the transmission lines. Other advantages will also be obvious to one having skill in the art.

Various implementations and arrangements are discussed with reference to electrical and electronics components and varied carriers and packages. While specific components (i.e., integrated circuit (IC) chip dies, wafers, substrates, printed circuit boards (PCB), discrete components, etc.) may be mentioned, this is not intended to be limiting, and is for ease of discussion and illustrative convenience. The techniques and devices discussed are applicable to any type or number of packages, packaged circuits or components, circuits (e.g., integrated circuits (IC), mixed circuits, ASICS, memory devices, processors, etc.), electrical components (e.g., sensors, transistors, diodes, etc.), groups of components, carrier structures (e.g., wafers, substrates, panels, boards, PCBs, etc.), and the like. References to a specific component are also applicable to other types of microelectronic elements, unless specified.

Implementations are explained in more detail below using a plurality of examples. Although various implementations and examples are discussed here and below, further implementations and examples may be possible by combining the features and elements of individual implementations and examples.

Example Stacked Transmission Line

FIG. 1 illustrates a pair of adjacent conductive traces, 102 and 104, which illustrate far end crosstalk induced noise, and provide an example environment for the disclosed techniques and devices. The illustrations of the conductive traces (e.g., 102 and 104) throughout the figures are not to scale, but are illustrated for convenience. In various embodiments, the conductive traces (102, 104) may have varying lengths, widths, shapes, cross-sections, routings and the like. In general, the conductive traces (102, 104) have at least a portion that runs substantially parallel and in close proximity.

As shown in the illustration, a signal may be intentionally propagated on a "driven line" or "aggressor line" (conductive trace 102 for example). Since at least a portion of an "un-driven line" or "victim line" (conductive trace 104 for example) runs substantially parallel to and in close proximity to the driven line (102), the un-driven line (104) and the driven line (102) can have an inductive coupling between them during the signal propagation. The inductive coupling can include a self-inductance Ls and a mutual inductance Lm. Consequently, as shown in FIG. 1, a far end crosstalk (FEXT) noise signal can be induced onto the un-driven line (104) from the driven line (102).

Generally, the FEXT noise signal induced onto the un-driven line (104) is caused by a difference in the capacitive coupling between the two traces (102, 104) relative to the inductive coupling between the two traces (102, 104). Capacitive coupling can include a self-capacitance Cs and a mutual capacitance Cm. If the difference between the ratios Cm/Cs and Lm/Ls is reduced to zero, then the amplitude of the FEXT noise signal is reduced to zero.

Figure 2:
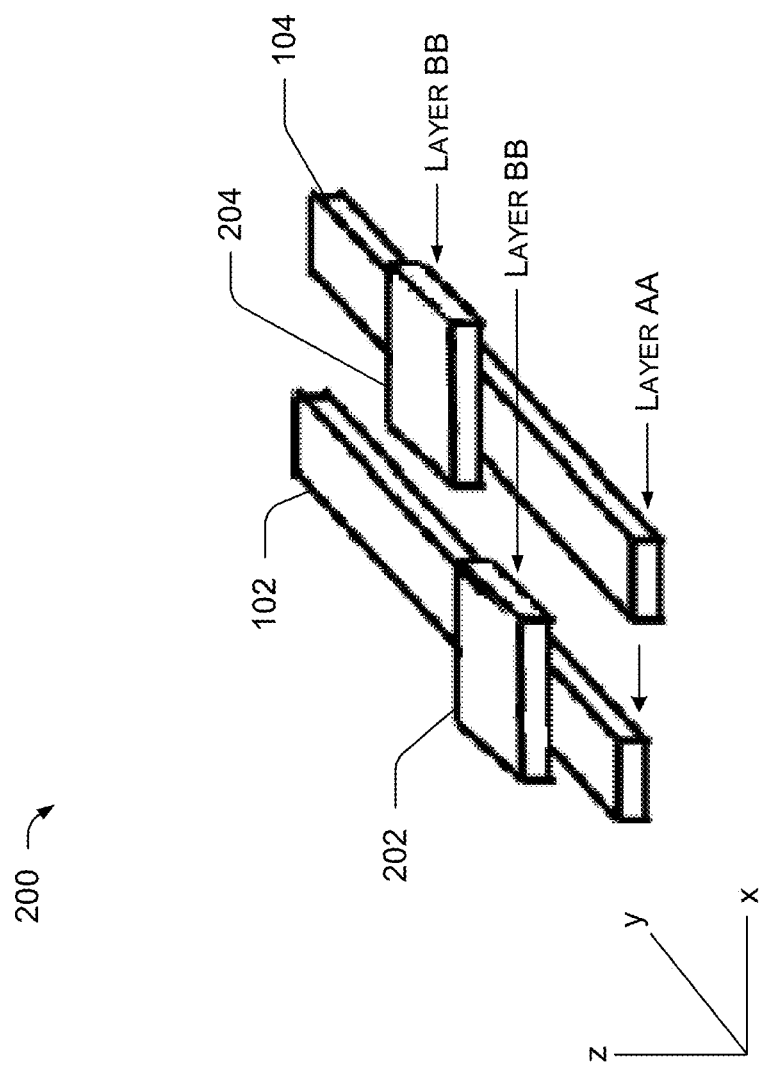
FIG. 2 shows an example embodiment of a stacked transmission line.
Figure 3:
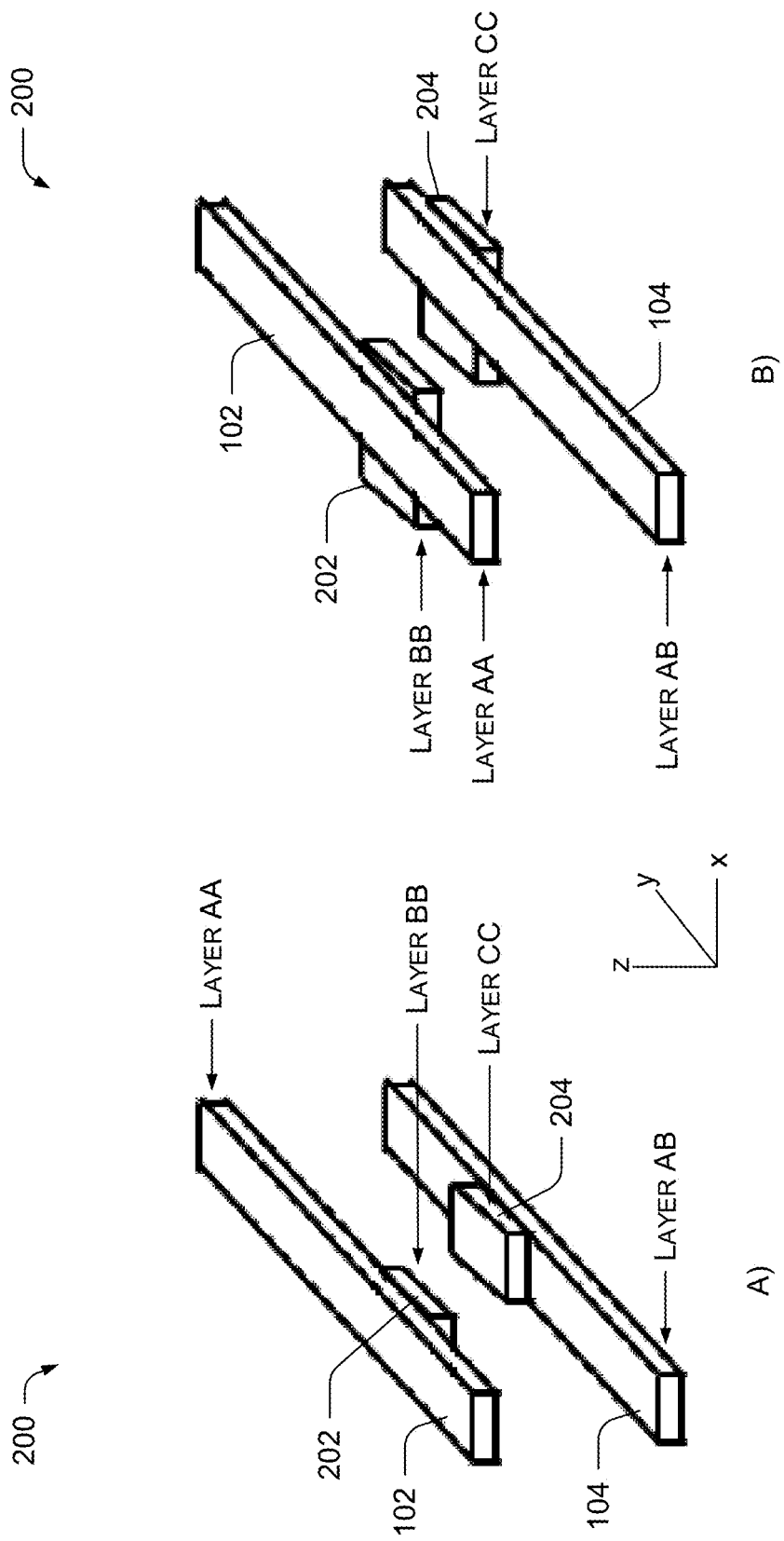
FIG. 3 shows two example embodiments of stacked transmission lines.

Referring to FIGS. 2 and 3, in various implementations, a stacked transmission line 200 can increase a capacitive coupling between the first (102) and second (104) conductive traces, and minimize the difference between the ratios Cm/Cs and Lm/Ls. This reduces the amplitude of the FEXT noise signal to a negligible value or to zero. As shown in FIGS. 2 and 3, in the various implementations, a stacked transmission line 200 comprises a multi-layer microelectronic structure 200 having a first conductive trace 102 disposed at a first spatial layer (e.g., layer AA) of a carrier or a package and a second conductive trace 104, either disposed at the first spatial layer AA (as shown at FIG. 2), or disposed at another spatial layer AB (as shown at FIGS. 3(A) and 3(B)), different from the first spatial layer AA.

Spatial layers (e.g., spatial layers AA, AB, BB, CC, DD) are herein defined as actual or virtual planes (illustrated as X-Y planes in the figures, but applicable to other planes while maintaining the relative spatial relationships described herein) making up the carrier or package or within the carrier or package. For example, a carrier may be comprised of multiple layers in three-dimensional space, and may also include multiple virtual layers above the topmost actual layer of the carrier, where components, traces, and other items are generally disposed. Similarly, a package may be comprised of multiple actual or virtual layers within and without, including layers for components, traces, etc.

In this disclosure, the spatial layers discussed are associated to actual layers of conductive material that are formed or stacked in a multi-layer, three-dimensional arrangement. The spatial layer planes may be defined to have the thickness of a typical conductive trace on a printed circuit board (PCB)

(e.g., tens of microns) to the thickness of a typical conductive trace on a densely packed integrated circuit (IC) chip (e.g., less than 10 microns). When illustrated in terms of X-Y planes, components described as being on different spatial layers from other components are above or below (+Z or −Z) the other components in three-dimensional space.

As shown in FIGS. 2 and 3, whether the first (102) and second (104) conductive traces are disposed on the same spatial layer (e.g., FIG. 2) or on different spatial layers (e.g., FIG. 3), at least a portion of the second conductive trace 104 is parallel to the first conductive trace 102, and in close proximity to the first conductive trace 102. In the various implementations, the first (102) and second (104) conductive traces comprise a transmission line for data, power, or other signal transmission at the carrier or within the package.

In an implementation, the stacked transmission line 200 includes a first plurality of conductive stubs 202 (e.g., conductive pieces, stub traces, drops, etc.) disposed at another spatial layer BB of the carrier or the package. The spatial layer BB is different from the spatial layer AA and the spatial layer AB. In other words, the first plurality of conductive stubs 202 is disposed at a different spatial layer than either the first conductive trace 102 or the second conductive trace 104. For example, as shown in FIGS. 2 and 3, the first plurality of conductive stubs 202 is stacked or formed (in a separate layer) either above the first conductive trace 102 or below the first conductive trace 102. In the implementation, the first plurality of conductive stubs 202 is electrically coupled to the first conductive trace 102.

In the implementation, the stacked transmission line 200 includes a second plurality of conductive stubs 204 disposed at a spatial layer CC of the carrier or the package. The spatial layer CC is different from the spatial layer AA and the spatial layer AB (but may be the same as the spatial layer BB in some embodiments). In other words, the second plurality of conductive stubs 204 is disposed at a different spatial layer than either the first conductive trace 102 or the second conductive trace 104. For example, as shown in FIGS. 2 and 3, the second plurality of conductive stubs 204 is stacked or formed (in a separate layer) either above the second conductive trace 102 or below the second conductive trace 102. In the implementation, the second plurality of conductive stubs 204 is electrically coupled to the second conductive trace 104.

In the implementation, the first (202) and second (204) pluralities of conductive stubs increase a capacitive coupling between the first (102) and second (104) conductive traces. The increased capacitive coupling due to the stubs 202 and 204 reduces the amplitude of the FEXT noise induced on the transmission line 200.

In some implementations, as shown in FIGS. 2 and 3, the first (202) and second (204) pluralities of conductive stubs are mechanically coupled directly to the first (102) and second (104) conductive traces, respectively. For example, in some embodiments, the first (202) and second (204) pluralities of conductive stubs are overlapped with the first (102) and second (104) conductive traces, respectively, and mechanically bonded. In other embodiments, the first (202) and second (204) pluralities of conductive stubs are formed (using deposition, etching, etc.) with the first (102) and second (104) conductive traces, respectively, in one or more processes. For example, the first (202) and second (204) pluralities of conductive stubs may be formed in a first process, and the first (102) and second (104) conductive traces formed in a second process so as to be mechanically and electrically bonded to the first (202) and second (204) pluralities of conductive stubs. In further embodiments, additional or alternate processes may be used to form the traces (102 and 104) and the stubs (202 and 204) on two, three, or four different spatial layers (as shown in FIGS. 2-10).

Figure 4:
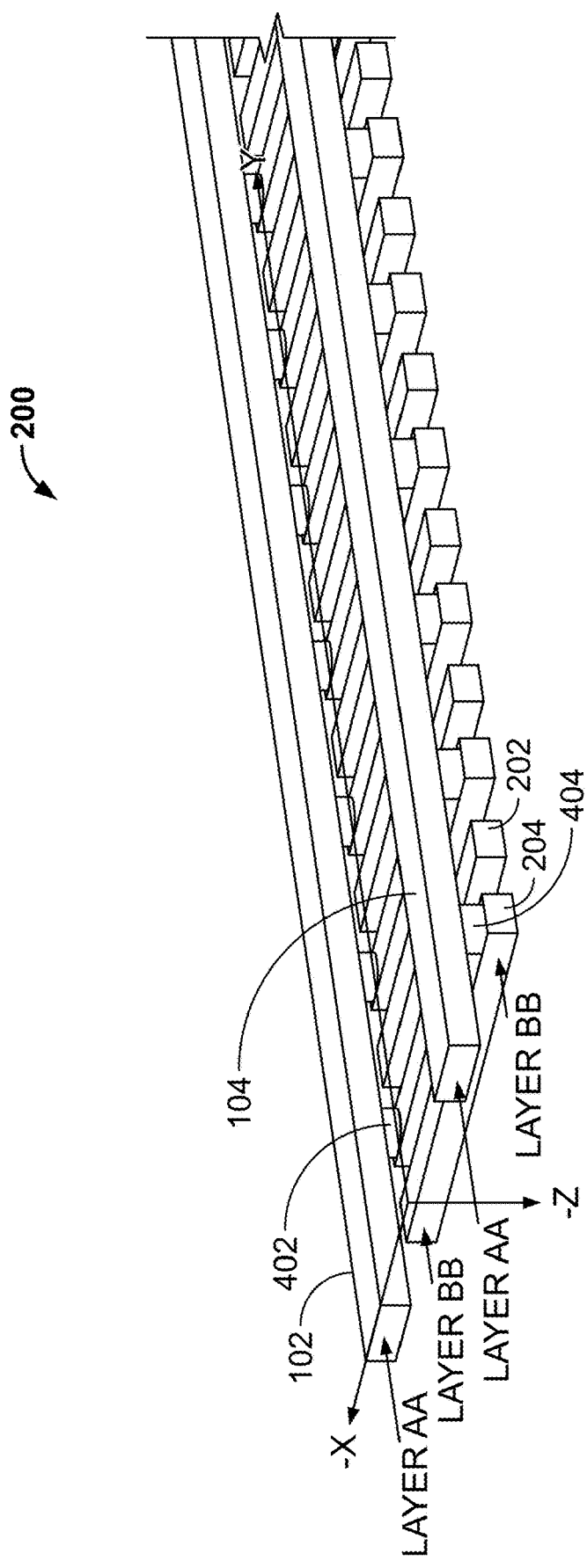
FIG. 4 shows an example stacked transmission line with vias, according to an example embodiment.
Figure 5:
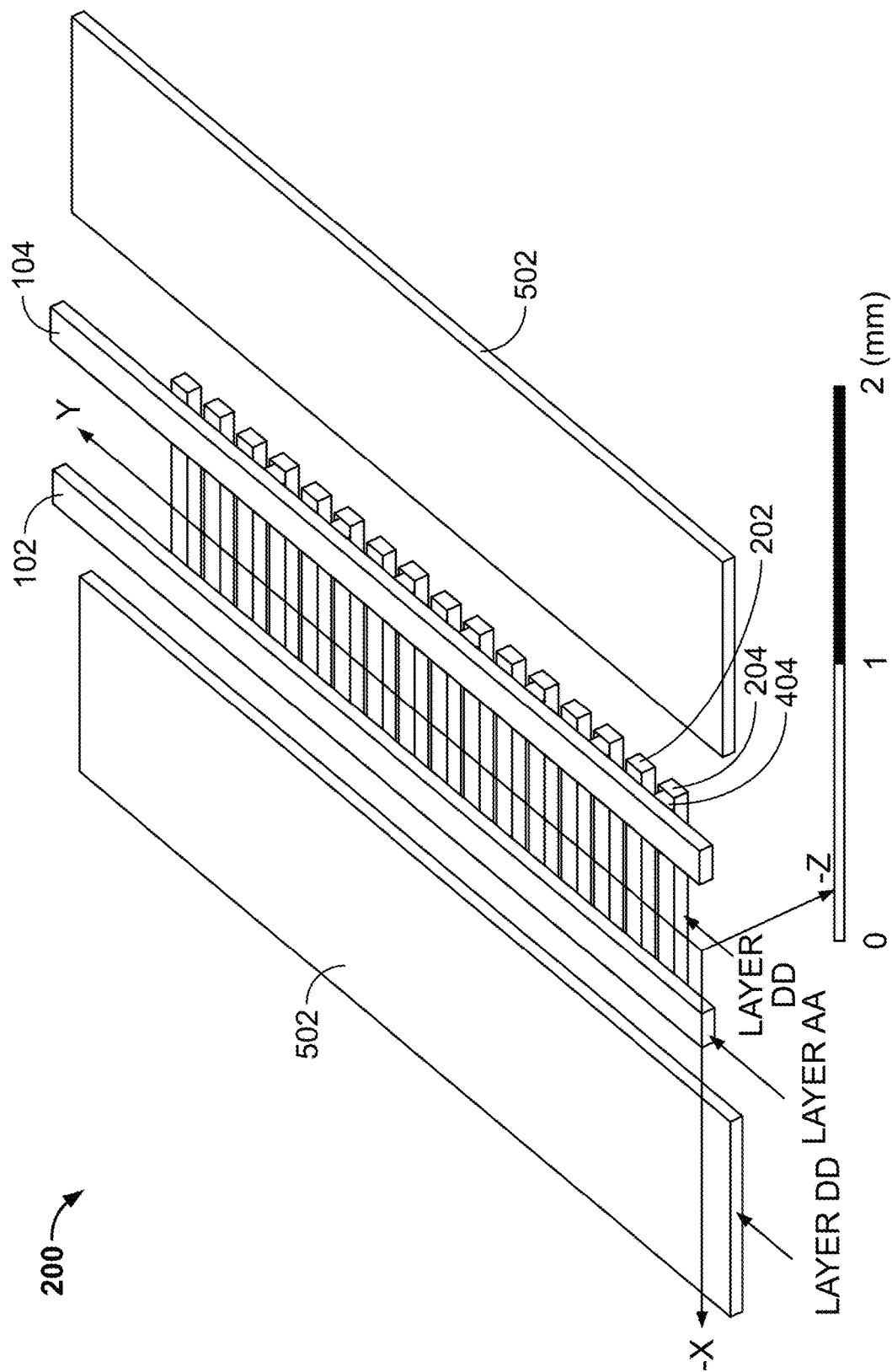
FIG. 5 shows another example stacked transmission line with vias, according to another example embodiment.

In another implementation, as shown in FIGS. 4 and 5, the stacked transmission line 200 includes a first plurality of conductive vias 402 electrically and mechanically coupling the first plurality of conductive stubs 202 to the first conductive trace 102 and a second plurality of conductive vias 404 electrically and mechanically coupling the second plurality of conductive stubs 204 to the second conductive trace 104. In the implementation, the first (102) and second (104) conductive traces are at a spatial layer AA and the first (202) and second (204) pluralities of conductive stubs are at another spatial layer BB, which is separated from layer AA by the height of the vias (402 and 404).

In various implementations, as shown in FIGS. 2-10, one or more individual stubs of the first plurality of conductive stubs 202 are disposed transverse to the first conductive trace 102 and are at least partially overlapped by the first conductive trace 102, and one or more individual stubs of the second plurality of conductive stubs 204 are disposed transverse to the second conductive trace 104 and are at least partially overlapped by the second conductive trace 104. Additionally, in some embodiments, as shown in FIGS. 4, 5, and 7-10, one or more individual stubs of the first plurality of conductive stubs 202 are at least partially overlapped by the second conductive trace 104 without being mechanically coupled to the second conductive trace 104 and one or more individual stubs of the second plurality of conductive stubs 204 are at least partially overlapped by the first conductive trace 102 without being mechanically coupled to the first conductive trace 102.

In the various implementations, as shown in FIGS. 4-7 and 9-10, stubs of the first plurality of conductive stubs 202 are joined to the first conductive trace 102 at a predetermined stub spacing and stubs of the second plurality of conductive stubs 204 are joined to the second conductive trace 104 at the same predetermined stub spacing. In the implementations, the stubs of the first plurality of conductive stubs 202 alternate with the stubs of the second plurality of conductive stubs 204 along a length of the transmission line 200. The use of the stubs (202 and 204) and the alternating arrangement of the stubs (202 and 204) allows for the traces (102, 104) and the transmission lines 200 to be spaced closer, with a finer pitch, for a more densely packed carrier or package.

In an alternate embodiment, one or more stubs of the first (202) or second (204) pluralities of conductive stubs may be coupled to the first (102) or second (104) conductive traces, respectively, at an angle that is not transverse to the first (102) or second (104) conductive traces, respectively. In the embodiment, the one or more stubs of the first (202) or second (204) pluralities of conductive stubs may still be arranged in parallel to each other, while not being transverse to the respective conductive trace (102 or 104).

Referring to FIG. 5, in an embodiment, a carrier or a package may include a ground plane, a power grid, or the like, including at least one pair of conductors 502 comprising power or ground conductors, disposed on a particular spatial layer (e.g., layer DD, for example). In the embodiment, the spatial layer DD of the ground plane, power grid, etc. may also be used for the location of the first (202) and/or second (204) pluralities of stubs. For example, at least one of the first (202) or second (204) pluralities of conductive stubs may be formed within a space between the conductors 502 of the ground plane, power grid, etc. In one example, a depression or hole may be formed on the ground plane by etching, or the like, and the first (202) and/or second (204) pluralities of stubs may be formed within the depression or hole. In the embodiment, the spatial layer DD is a layer other than the spatial layer (AA) of the first (102) or second (104) conductive traces of the transmission line 200.

The techniques and devices shown are also applicable to routing arrangements with more than one pair of conductive traces (102, 104). As shown at FIGS. 6, 7, 10, and 11, one or more additional conductive traces (602, 1002) may also be disposed at the spatial layer AA. At least a portion of each additional conductive trace (602, 1002) is parallel and proximate to the first (102) and/or second (104) conductive traces. Accordingly, there is an inductive coupling between the additional conductive trace (602, 1002) and the first (102) and/or second (104) conductive traces, which can cause FEXT noise to be induced onto one or more of the conductive traces (102, 104, 602, 1002).

In an implementation, one or more additional pluralities of conductive stubs (604, 1004) are disposed at one or more other spatial layers of the carrier or the package, where the one or more other spatial layers are different from the spatial layer AA (but may be the same as layers BB or CC, in some embodiments). The one or more additional pluralities of conductive stubs (604, 1004) are electrically coupled to the respective one or more additional conductive traces (602, 1002), forming the multi-level, stacked transmission line 200. In the implementation, the one or more additional pluralities of conductive stubs (604, 1004) increase a capacitive coupling between the one or more additional conductive traces (602, 1002) and the first (102) or second (104) conductive traces, thereby reducing or eliminating FEXT noise in the traces (102, 104, 602, 1002).

Figure 8:
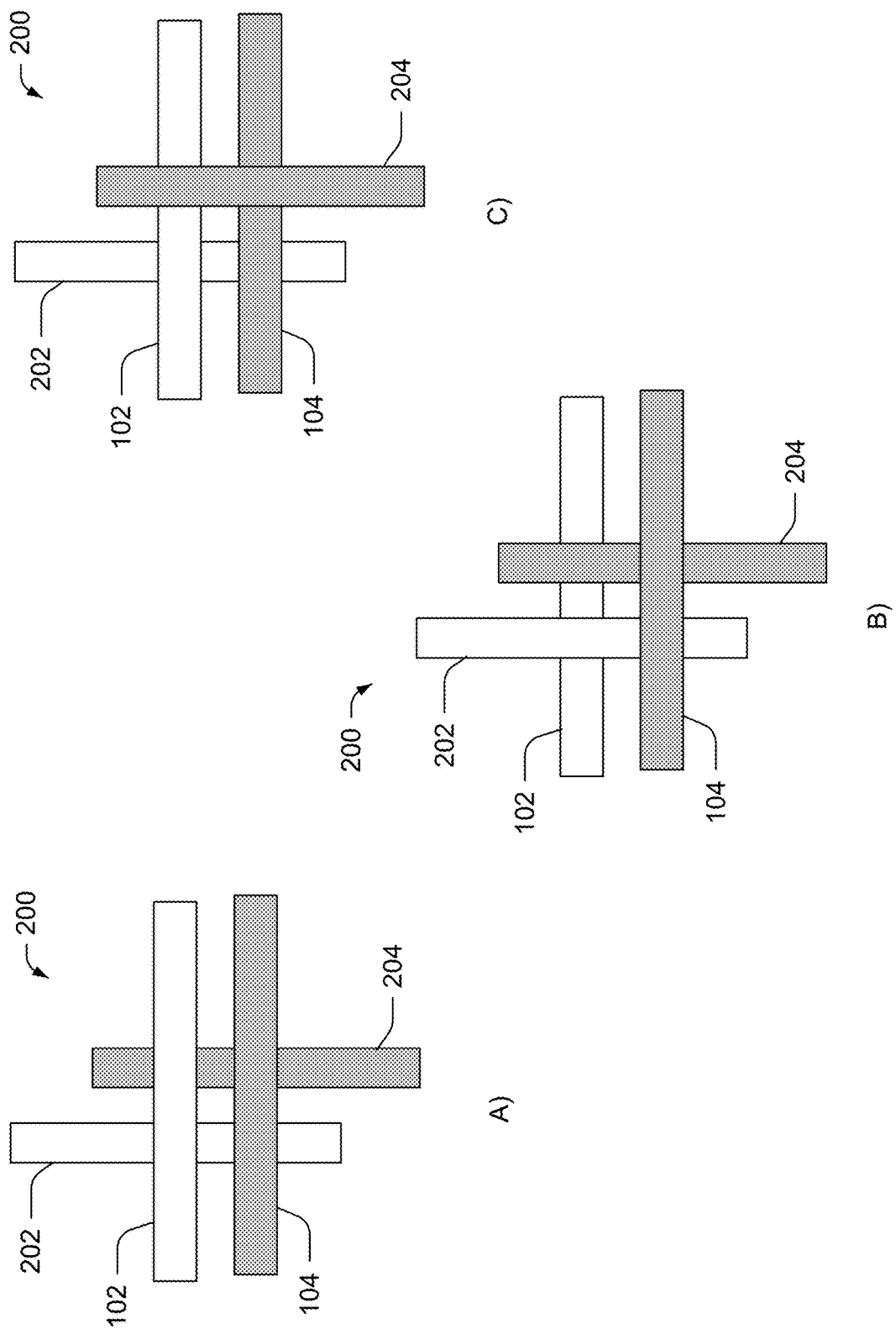
Figure 9:
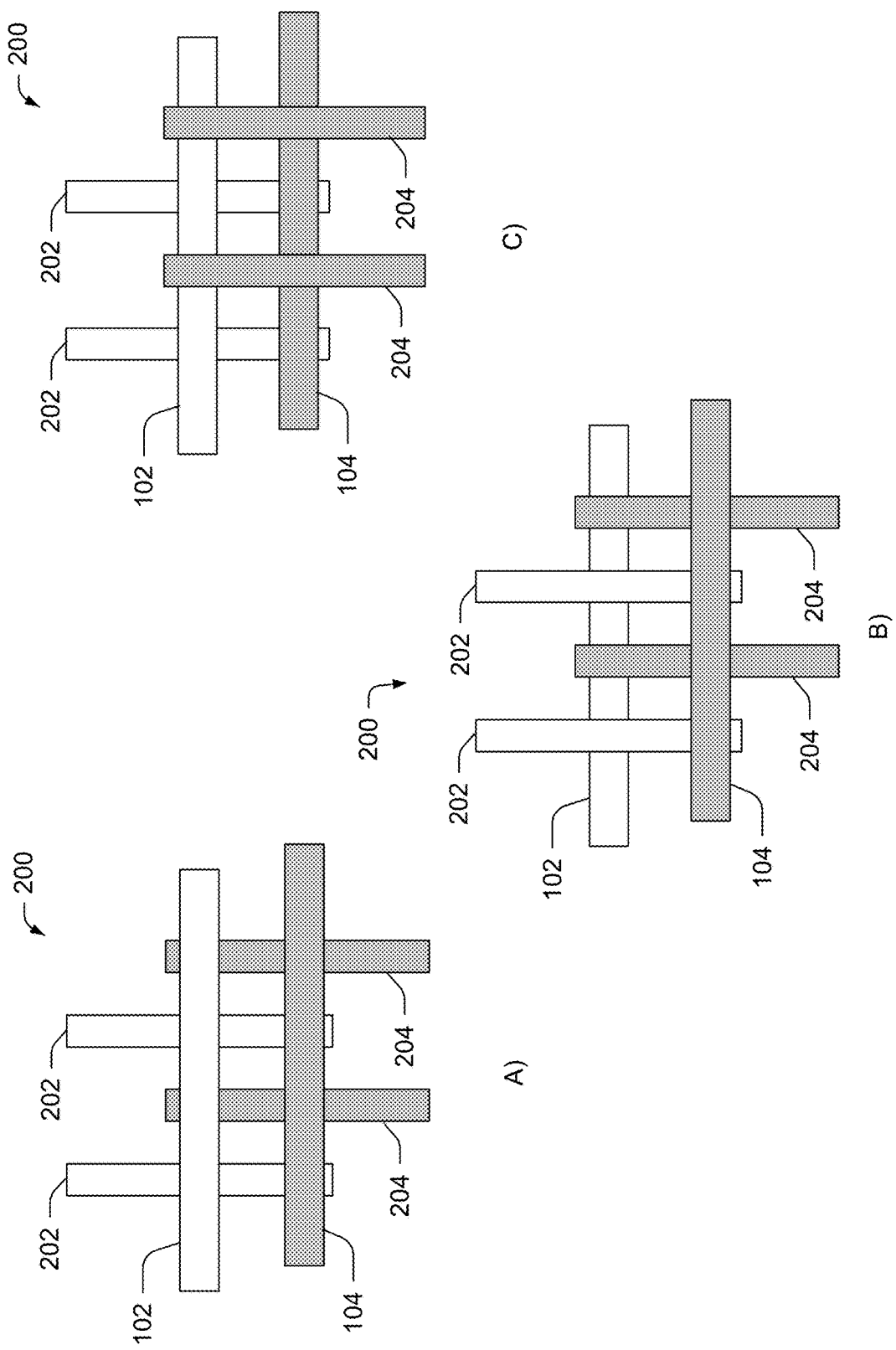

As shown in FIGS. 8 and 9, in various embodiments, a stacked transmission line 200 may have a variety of three-dimensional forms. The pluralities of conductive stubs (202, 204, 602, and 1002) may be disposed on the same spatial layer (as in FIGS. 8(A) and 9(A), for example), or one or more of the pluralities of conductive stubs (202, 204, 602, and 1002) may be disposed on different spatial layers (as in FIGS. 8(B & C) and 9(B & C), for example).

When one or more of the pluralities of conductive stubs (202, 204, 602, 1002) are disposed on the same spatial layer, the stubs (202, 204, 602, 1002) may be arranged in an alternating pattern (stubs of the first plurality of conductive stubs 202 alternating with stubs of the second plurality of conductive stubs 204, and any additional stubs of additional pluralities of stubs (602, 1002) along a length of the transmission line 200). The stubs (202, 204) and any additional stubs (602, and 1002) have a predetermined stub spacing (as shown at FIGS. 4-7, and 9-11). In the embodiments, a combined capacitance of the transmission line 200 matches a combined inductance of the transmission line 200 based on the arrangement of the first (202) and second (204) pluralities of conductive stubs, and any additional pluralities of stubs (602, 1002), if present.

One or more patterns or arrangements may also be used when one or more of the pluralities of conductive stubs (202, 204, 602, and 1002) are disposed on different spatial layers. In one example, as shown in FIGS. 8(B) and 9(B), the first plurality of conductive stubs 202 is joined to a surface of the first conductive trace 102 facing the second conductive trace 104 and the second plurality of conductive stubs 204 is joined to a surface of the second conductive trace 104 facing the first conductive trace 102. In another example, as shown in FIGS. 8(C) and 9(C), the first plurality of conductive stubs 202 is joined to a surface of the first conductive trace 102 facing away from the second conductive trace 104 and the second plurality of conductive stubs 204 is joined to a surface of the second conductive trace 104 facing away from the first conductive trace 102. Here also, a combined capacitance of the transmission line 200 matches a combined inductance of the transmission line 200 based on the arrangement of the first 202 and second 204 pluralities of conductive stubs, and any additional pluralities of stubs (602, 1002), if present.

Figure 10:
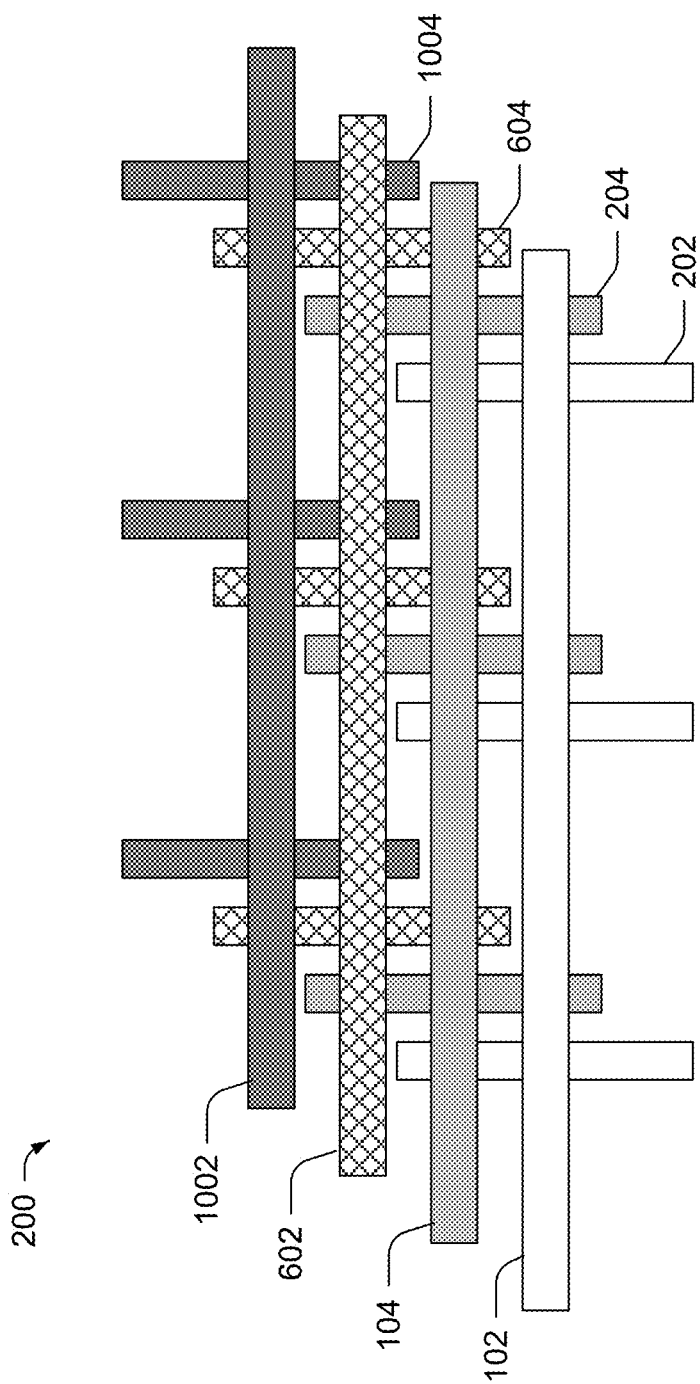
Figure 11:
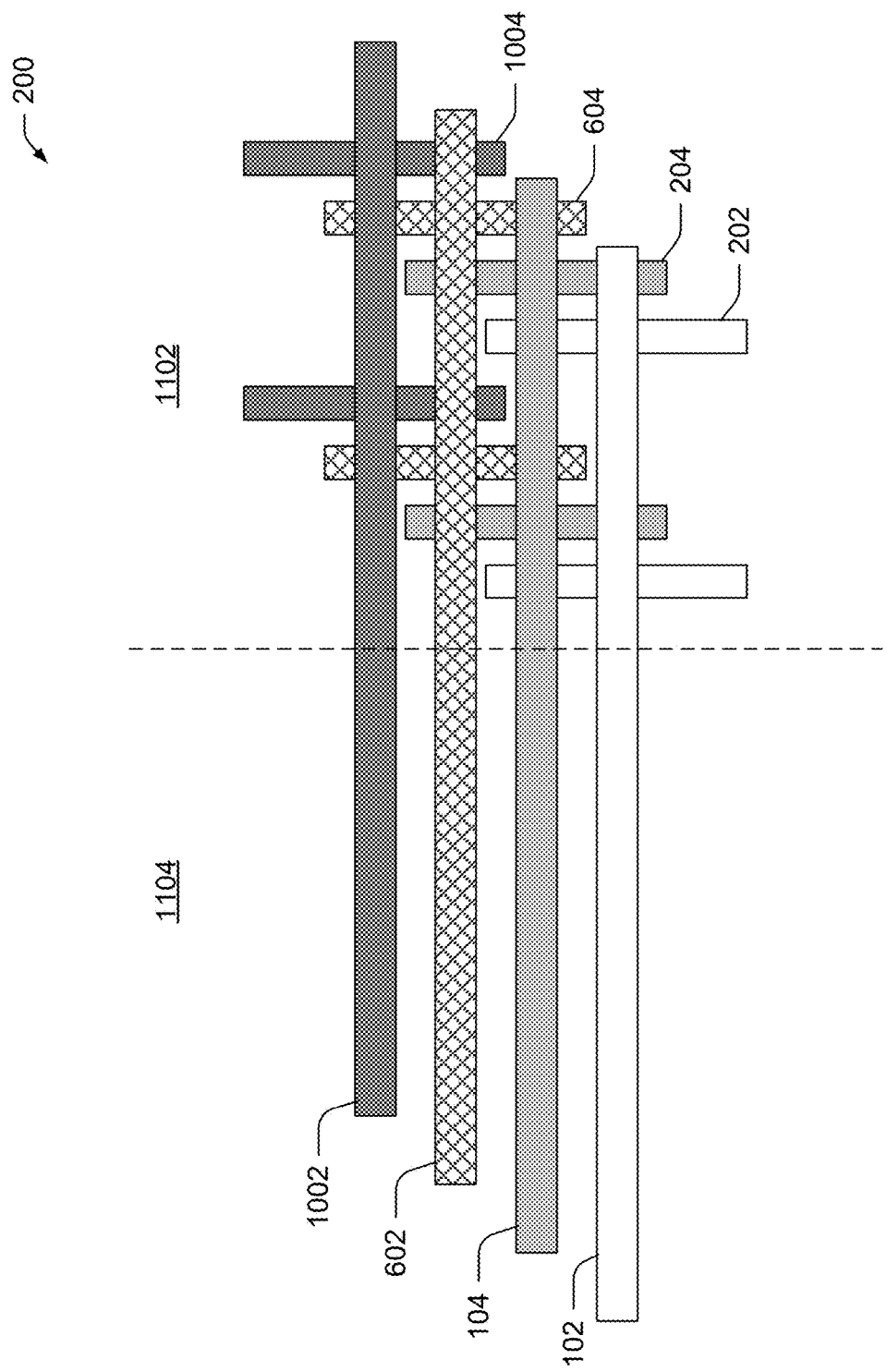

Referring to FIGS. 10 and 11, in some implementations, when one or more pairs of conductive traces (e.g., pairs 102 & 104; and 602 & 1002) are present, one or more of the pairs of conductive traces may comprise a differential interconnect. For example, the pair may be used for differential signaling. In the implementations, the pluralities of conductive stubs (e.g., stubs 202 & 204; and 604 & 1004) that are coupled to each of the respective conductive traces are arranged to reduce or eliminate differential far end crosstalk (FEXT) noise at each differential interconnect.

In an implementation, as shown at FIG. 11, the conductive traces (102, 104, 602, 1002) of the transmission line 200 (including differential pairs) may include conductive stubs (202, 204, 602, 1002) at a portion of the transmission line 200. In other words, the transmission line 200 may not include conductive stubs (202, 204, 602, 1002) along an entire length of the traces (102, 104, 602, 1002). In the implementation, as shown in FIG. 11, the transmission line 200 includes a compensating portion 1102 and a remaining portion 1104. The pluralities of conductive stubs (202, 204, 602, 1002) are coupled to the respective conductive traces (102, 104, 602, 1002) at the compensating portion 1102 of the transmission line 200. The remaining portion 1104 can be kept free of conductive stubs, if desired. In the implementation, the compensating portion 1102 is arranged to reduce or eliminate far end crosstalk (FEXT) noise at the remaining portion 1104 of the transmission line 200 or at the compensating portion 1102 and the remaining portion 1104.

In various embodiments, the conductive stubs (202, 204, 604, 1004) and the vias (402, 404) are comprised of a conductive material such as a metal (e.g., copper, gold, titanium, chromium, aluminum, etc.), an alloy, or other conductive material. In some embodiments, the conductive stubs (202, 204, 604, 1004) and the vias (402, 404) are comprised of the same conductive material as the conductive traces (102, 202, 602, 1002).

Figure 6:
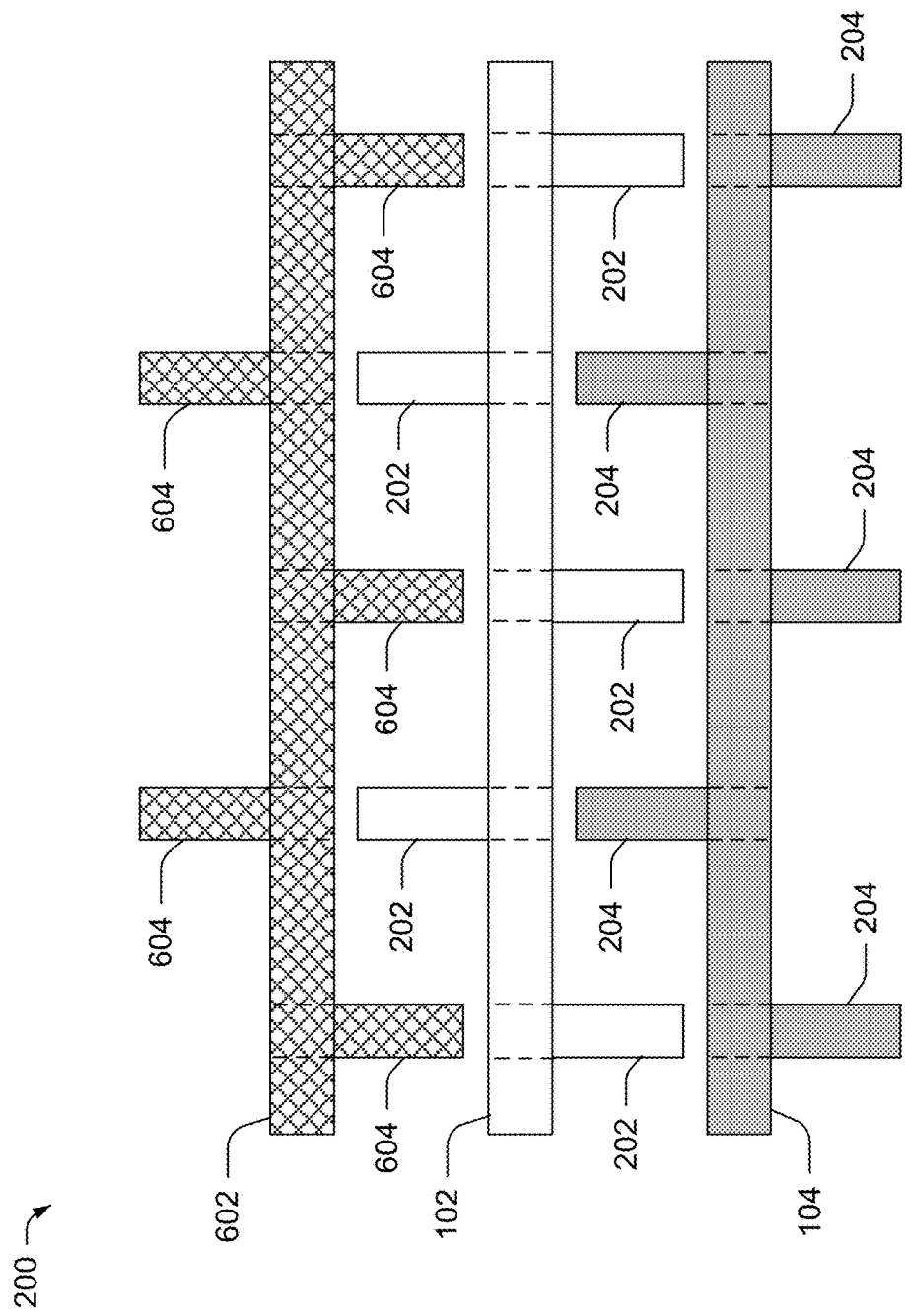
FIGS. 6-11 show additional examples of stacked transmission lines, according to various embodiments.
Figure 7:
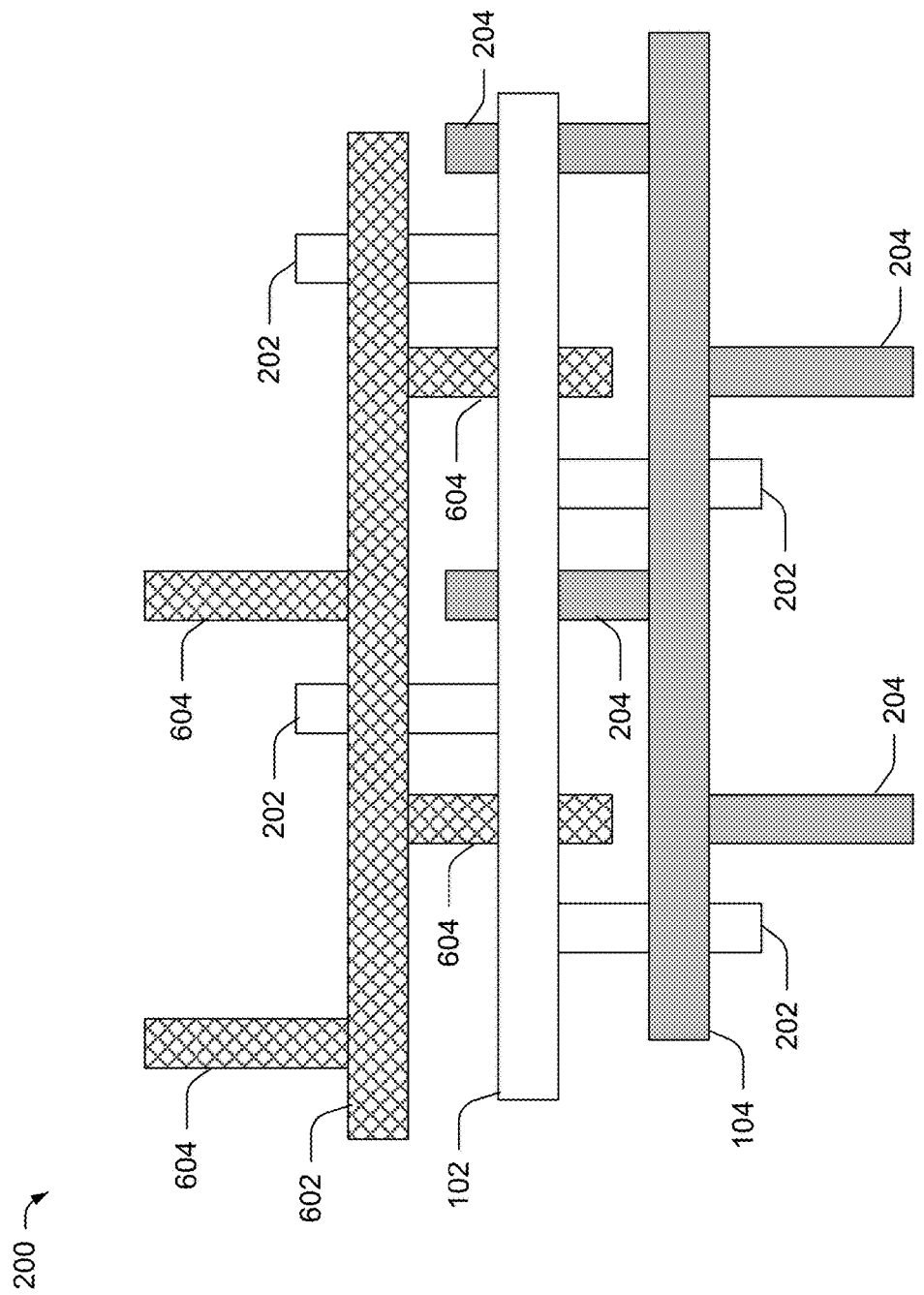

In some implementations, as shown in FIGS. 2-7, the conductive stubs (202, 204, 604) are shorter stubs, fully or partially overlapped by the associated conductive traces (102, 202, 602), with some stubs (202, 204, 604) extending transversely from one side of the associated conductive traces (102, 202, 602). In some examples, as shown in FIGS. 6-7, the conductive stubs (202, 204, 604) extend from alternating sides of the associated conductive traces (102, 202, 602) in an alternating pattern. In other implementations, as shown in FIGS. 8-11, the conductive stubs (202, 204, 604, 1004) may be somewhat longer, and extend transversely from both sides of the associated conductive traces (102, 202, 602, 1002).

Example Process

Figure 12:
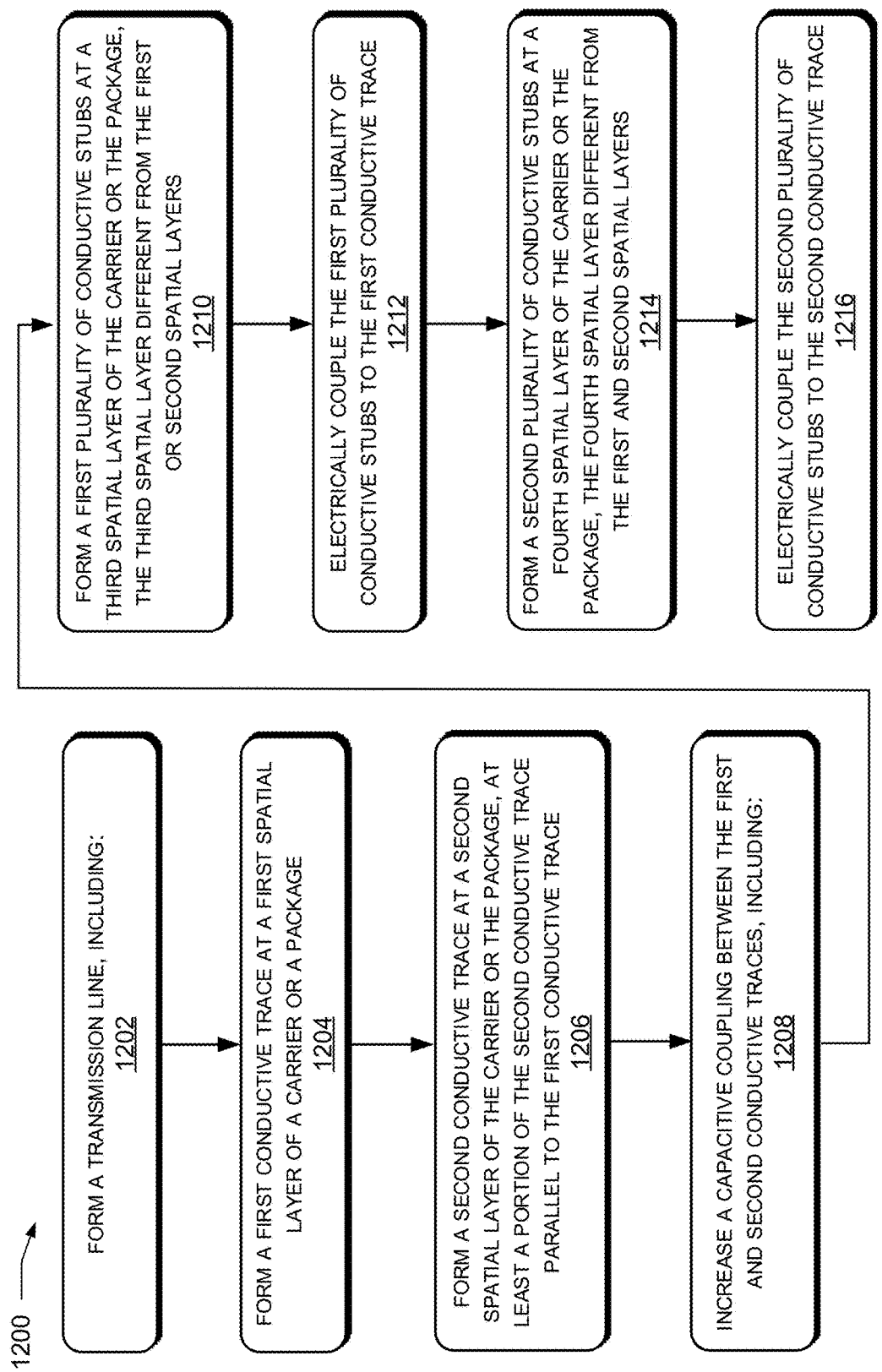
FIG. 12 is a flow diagram illustrating an example process for forming a stacked transmission line, according to an implementation.

FIG. 12 is a flow diagram illustrating an example process 1200 for forming a stacked transmission line (such as the transmission line 200, for example) according to various implementations. The process 1200 describes forming a multi-layer microelectronic structure on a carrier, on or within a package, or at another circuit environment. In various embodiments, the three-dimensional stacked transmission line reduces or eliminates far end crosstalk (FEXT)

noise induced onto the transmission line. The process of FIG. 12 has reference to FIGS. 1-11, and the discussion above.

Referring to FIG. 12, at 1202, the process includes forming a transmission line, which includes at least two conductors, on a carrier or on or within a package. In an embodiment, the transmission line may comprise a microstrip transmission line. In another embodiment, each pair of two conductors may comprise a differential interconnect. Forming the transmission line includes the following blocks:

At block 1204, the process includes forming a first conductive trace (such as conductive trace 102, for example) at a first spatial layer of a carrier or a package. At block 1206, the process includes forming a second conductive trace (such as conductive trace 104, for example) at a second spatial layer of the carrier or the package. In one example, the second spatial layer comprises the first spatial layer. In other words, the first and second conductive traces may be formed on the same layer or on different layers. The first and second conductive traces may be formed by deposition, plating, etching, or the like. At least a portion of the second conductive trace is proximate to and parallel to the first conductive trace. The first and second conductive traces comprise the transmission line.

At block 1208, the process includes increasing a capacitive coupling between the first and second conductive traces, to approach or to match the inductive coupling of the first and second conductive traces. Increasing the capacitive coupling includes the following blocks:

At block 1210, the process includes forming a first plurality of conductive stubs (such as conductive stubs 202, for example) at a third spatial layer of the carrier or the package, the third spatial layer different from the first or second spatial layers. At block 1212, the process includes electrically coupling the first plurality of conductive stubs to the first conductive trace. At block 1214, the process includes forming a second plurality of conductive stubs (such as conductive stubs 204, for example) at a fourth spatial layer of the carrier or the package, the fourth spatial layer different from the first and second spatial layers. In one example, the fourth spatial layer comprises the third spatial layer. In other words, the first and second pluralities of conductive stubs may be formed on the same layer or on different layers. At block 1216, the process includes electrically coupling the second plurality of conductive stubs to the second conductive trace.

In an embodiment, the transmission line includes a compensating portion (such as compensating portion 1102, for example) and a remaining portion (such as remaining portion 1104, for example). In the embodiment, the first and second pluralities of conductive stubs are coupled to the first and second conductive traces respectively, at the compensating portion of the transmission line. Having the stubs, the compensating portion is arranged to reduce or eliminate far end crosstalk (FEXT) noise at the remaining portion of the transmission line or at the compensating portion and the remaining portion of the transmission line.

The first and second pluralities of conductive stubs may also be formed by deposition, plating, etching, or the like. In alternate examples, the conductive stubs are formed in the same process with the conductive traces, or in separate processes. In an implementation, the process includes forming stubs of the first and second pluralities of conductive stubs transverse to the parallel portion of the first and second conductive traces. In one example, stubs of the first plurality of conductive stubs alternate with stubs of the second plurality of conductive stubs along a length of the transmission line.

In another implementation, the process includes coupling the first plurality of conductive stubs to the first conductive trace using first conductive vias disposed at a spatial layer other than the first spatial layer and coupling the second plurality of conductive stubs to the second conductive trace using second conductive vias disposed at a spatial layer other than the second spatial layer. In other words, the conductive vias mechanically and electrically couple the conductive stubs to the respective conductive traces. Further, the vias offset the conductive stubs from the respective conductive traces a distance equal to the height of the vias.

In another implementation, the process includes forming or coupling the first plurality of conductive stubs to a top-side surface of the first conductive trace and forming or coupling the second plurality of conductive stubs to a corresponding top-side surface of the second conductive trace. In another example, the process includes forming or coupling the first plurality of conductive stubs to a bottom-side surface of the first conductive trace and forming or coupling the second plurality of conductive stubs to a corresponding bottom-side surface of the second conductive trace. In other examples, the conductive stubs are coupled to the conductive traces in other arrangements.

In various implementations, the process includes matching the magnitude of combined inductance of the transmission line with the magnitude of combined capacitance of the transmission line, based on arranging the first and second pluralities of conductive stubs with respect to the first and second conductive traces. In another example, the process includes reducing or eliminating far end crosstalk (FEXT) noise on the transmission line, based on arranging the first and second pluralities of conductive stubs with respect to the first and second conductive traces.

In alternate implementations, the process includes reducing a pitch of the first and second conductive traces or increasing a quantity of conductive traces per area on the carrier or within the package, based on arranging the first and second pluralities of conductive stubs in one or more different spatial layers than the first or second spatial layers, forming a multi-layered, three-dimensional arrangement.

Different configurations of a stacked transmission line 200 than those illustrated or discussed may be possible with different implementations, and are within the scope of the disclosure. The variations may have fewer elements than illustrated in the examples shown in FIGS. 1-11, or they may have more or alternative elements than those shown.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A multi-layer microelectronic structure, comprising:
   a first conductive trace disposed at a first spatial layer of a carrier or a package, the first conductive trace being coplanar to the first spatial layer;
   a second conductive trace disposed at the first spatial layer, parallel to and coplanar to the first conductive trace, the first and second conductive traces comprising a transmission line;
   a first plurality of conductive stubs disposed at a second spatial layer of the carrier or the package below and parallel to the first spatial layer, the first plurality of conductive stubs is electrically coupled to the first conductive trace and extends linearly from below the first conductive trace to below the second conductive trace, wherein each stub of the first plurality of conductive stubs is overlapped by the first conductive trace and is overlapped by the second conductive trace without being mechanically coupled to the second conductive trace, each stub of the first plurality of conductive stubs forms a capacitor with the second conductive trace;
   a second plurality of conductive stubs disposed at the second spatial layer of the carrier or the package and is electrically coupled to the second conductive trace and extends linearly from below the second conductive trace to below the first conductive trace, wherein each stub of the second plurality of conductive stubs is overlapped by the second conductive trace and is overlapped by the first conductive trace without being mechanically coupled to the first conductive trace, each stub of the second plurality of conductive stubs forms a capacitor with the first conductive trace, wherein the stubs of the second plurality of conductive stubs are parallel to the stubs of the first plurality of conductive stubs in an alternating interlaced pattern, the first and second pluralities of conductive stubs being adapted to increase a capacitive coupling between the first and second conductive traces based on an arrangement and an orientation of the first and second pluralities of conductive stubs; and
   at least a first conductive segment disposed at the second spatial layer and adjacent to the first conductive trace and at least a second conductive segment disposed at the second spatial layer and adjacent to the second conductive trace.

2. The multi-layer microelectronic structure of claim 1, further comprising a first plurality of conductive vias disposed on a surface of the first conductive trace and electrically and mechanically coupling the first plurality of conductive stubs to the first conductive trace and a second plurality of conductive vias disposed on a surface of the second conductive trace and electrically and mechanically coupling the second plurality of conductive stubs to the second conductive trace, wherein the first plurality of conductive stubs and the second plurality of conductive stubs are offset from the first conductive trace and the second conductive trace, respectively, a distance equal to a height of the first plurality of conductive vias and the second plurality of conductive vias, respectively.

3. The multi-layer microelectronic structure of claim 1, further comprising one or more additional conductive traces disposed at the first spatial layer, at least a portion of each additional conductive trace parallel to the first and second conductive traces, and one or more additional pluralities of conductive stubs disposed at one or more other spatial layers of the carrier or the package and electrically coupled to the respective one or more additional conductive traces, the one or more other spatial layers different from the first spatial layer and parallel to the first spatial layer, and the one or more additional pluralities of conductive stubs increasing a capacitive coupling between the one or more additional conductive traces and the first or second conductive traces.

4. The multi-layer microelectronic structure of claim 1, wherein stubs of the first plurality of conductive stubs are disposed at a non-transverse angle to the first conductive trace and stubs of the second plurality of conductive stubs are disposed at a non-transverse angle to the second conductive trace.

5. The multi-layer microelectronic structure of claim 1, wherein at least a portion of individual conductive stubs of the first plurality of conductive stubs are at least partly overlapped by at least a portion of individual conductive stubs of the second plurality of conductive stubs in a plan view, without being mechanically coupled.

6. The multi-layer microelectronic structure of claim 1, wherein alternating stubs of the first plurality of conductive stubs protrude from alternating opposite sides of the first conductive trace and alternating stubs of the second plurality of conductive stubs protrude from alternating opposite sides of the second conductive trace, the stubs of the first plurality of conductive stubs being parallel to the stubs of the second plurality of conductive stubs.

7. The multi-layer microelectronic structure of claim 1, wherein the transmission line includes a compensating portion and a remaining portion, the first and second pluralities of conductive stubs coupled to the first and second conductive traces respectively at the compensating portion of the transmission line, the compensating portion arranged to reduce or eliminate far end crosstalk (FEXT) noise at least at the remaining portion of the transmission line.

8. The multi-layer microelectronic structure of claim 1, wherein stubs of the first plurality of conductive stubs are joined to the first conductive trace with a predetermined stub spacing and stubs of the second plurality of conductive stubs are joined to the second conductive trace with the predetermined stub spacing, the stubs of the first plurality alternating with the stubs of the second plurality along a length of the transmission line.

9. The multi-layer microelectronic structure of claim 1, further comprising a ground plane of the carrier or the package disposed at a spatial layer other than the first spatial layer of the carrier or the package and parallel to the first spatial layer, and wherein at least one of the first or second pluralities of conductive stubs are formed within a depression or a hole within the ground plane.

10. The multi-layer microelectronic structure of claim 1, wherein a combined capacitance of the transmission line matches a combined inductance of the transmission line based on the arrangement of the first and second pluralities of conductive stubs.

11. A method of fabricating a multi-layer microelectronic structure, comprising:
    forming a transmission line, including:

forming a first conductive trace at a first spatial layer of a carrier or a package, the first conductive trace being coplanar to the first spatial layer;

forming a second conductive trace at the first spatial layer, parallel to and coplanar to the first conductive trace, the first and second conductive traces comprising the transmission line; and increasing a capacitive coupling between the first and second conductive traces, including:

forming a first plurality of conductive stubs at a second spatial layer of the carrier or the package below and parallel to the first spatial layer, the first plurality of conductive stubs extending linearly from below the first conductive trace to below the second conductive trace, wherein each stub of the first plurality of conductive stubs is overlapped by the first conductive trace and is overlapped by the second conductive trace without being mechanically coupled to the second conductive trace, each stub of the first plurality of conductive stubs forms a capacitor with the second conductive trace;

electrically coupling the first plurality of conductive stubs to the first conductive trace;

forming a second plurality of conductive stubs at the second spatial layer of the carrier or the package, the second plurality of conductive stubs extending linearly from below the second conductive trace to below the first conductive trace, wherein each stub of the second plurality of conductive stubs is overlapped by the second conductive trace and is overlapped by the first conductive trace without being mechanically coupled to the first conductive trace, each stub of the second plurality of conductive stubs forms a capacitor with the first conductive trace, wherein the stubs of the second plurality of conductive stubs are parallel to the stubs of the first plurality of conductive stubs in an alternating interlaced pattern;

electrically coupling the second plurality of conductive stubs to the second conductive trace; and forming at least a first conductive segment disposed at the second spatial layer and adjacent to the first conductive trace and at least a second conductive segment disposed at the second spatial layer and adjacent to the second conductive trace.

12. The method of claim 11, further comprising coupling the first plurality of conductive stubs to the first conductive trace using first conductive vias disposed on a surface of the first conductive trace and coupling the second plurality of conductive stubs to the second conductive trace using second conductive vias disposed on a surface of the second conductive trace.

13. The method of claim 11, further comprising forming or coupling the first plurality of conductive stubs to a top-side surface of the first conductive trace and forming or coupling the second plurality of conductive stubs to a corresponding top-side surface of the second conductive trace or forming or coupling the first plurality of conductive stubs to a bottom-side surface of the first conductive trace and forming or coupling the second plurality of conductive stubs to a corresponding bottom-side surface of the second conductive trace.

14. The method of claim 11, further comprising reducing or eliminating far end crosstalk (FEXT) noise on the transmission line, based on arranging the first and second pluralities of conductive stubs with respect to the first and second conductive traces.

15. The method of claim 11, further comprising matching a magnitude of combined inductance of the transmission line with a magnitude of combined capacitance of the transmission line based on arranging the first and second pluralities of conductive stubs with respect to the first and second conductive traces.

16. A multi-layer microelectronic structure, comprising:

a first conductive trace disposed at a first spatial layer of a carrier or a package, the first conductive trace being coplanar to the first spatial layer;

a second conductive trace disposed at the first spatial layer of the carrier or the package and coplanar to the first conductive trace, at least a portion of the second conductive trace parallel to the first conductive trace, the first and second conductive traces comprising a transmission line;

one or more first conductive stubs disposed at a second spatial layer of the carrier or the package and electrically coupled to the first conductive trace, the second spatial layer different from the first spatial layer and the second spatial layer being parallel to the first spatial layer, at least a portion of each of the one or more first conductive stubs fully overlaps a segment of the first conductive trace in a plan view;

one or more second conductive stubs disposed at a third spatial layer of the carrier or the package and electrically coupled to the second conductive trace, the third spatial layer different from the first spatial layer and the third spatial layer being parallel to the first spatial layer, at least a portion of each of the one or more second conductive stubs fully overlaps a segment of the second conductive trace in a plan view, the one or more first and second conductive stubs adapted to increase a capacitive coupling between the first and second conductive traces based on an arrangement and an orientation of the one or more first and second conductive stubs; and at least a first conductive segment disposed at the second spatial layer and adjacent to the first conductive trace and at least a second conductive segment disposed at the second spatial layer and adjacent to the second conductive trace.

17. The multi-layer microelectronic structure of claim 16, wherein the third spatial layer comprises the second spatial layer.

18. A multi-layer microelectronic structure, comprising:

a first conductive trace disposed at a first spatial layer of a carrier or a package, the first conductive trace being coplanar to the first spatial layer;

a second conductive trace disposed at the first spatial layer of the carrier or the package and coplanar to the first conductive trace, at least a portion of the second conductive trace parallel to the first conductive trace, the first and second conductive traces comprising a transmission line;

one or more first conductive stubs disposed at a second, different spatial layer of the carrier or the package and electrically coupled to the first conductive trace, at least a portion of each of the one or more first conductive stubs at least partially overlaps a portion of the first conductive trace in a plan view;

one or more second conductive stubs disposed at the second spatial layer of the carrier or the package and electrically coupled to the second conductive trace, at least a portion of each of the one or more second conductive stubs at least partially overlaps a portion of the second conductive trace in a plan view; and at least a first conductive segment disposed at the second spatial layer and adjacent to the first conductive trace and at least a second conductive segment disposed at the second spatial layer and adjacent to the second conductive trace.

* * * * *